(12) United States Patent
Busch et al.

(10) Patent No.: US 8,692,305 B2
(45) Date of Patent: Apr. 8, 2014

(54) SEMICONDUCTOR DEVICES AND STRUCTURES INCLUDING AT LEAST PARTIALLY FORMED CONTAINER CAPACITORS

(75) Inventors: Brett Busch, Boise, ID (US); Kevin R. Shea, Boise, ID (US); Thomas A. Figura, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 36 days.

(21) Appl. No.: 13/286,702

(22) Filed: Nov. 1, 2011

(65) Prior Publication Data

US 2012/0043596 A1 Feb. 23, 2012

Related U.S. Application Data

(63) Continuation of application No. 12/365,519, filed on Feb. 4, 2009, now Pat. No. 8,058,126.

(51) Int. Cl.
*H01L 27/108* (2006.01)
*H01L 29/94* (2006.01)

(52) U.S. Cl.
USPC .................. 257/296; 257/E21.648; 438/239

(58) Field of Classification Search
USPC .................................................. 257/E21.651
See application file for complete search history.

(56) References Cited

U.S. PATENT DOCUMENTS

| | | | |
|---|---|---|---|
| 5,661,064 A | 8/1997 | Figura et al. | |
| 5,889,300 A | 3/1999 | Figura et al. | |
| 5,891,768 A | 4/1999 | Figura et al. | |
| 6,238,969 B1 | 5/2001 | Figura et al. | |
| 6,507,064 B1 | 1/2003 | Tang et al. | |
| 6,599,799 B2 | 7/2003 | Tang et al. | |
| 6,620,686 B2 * | 9/2003 | Kim et al. | 438/258 |
| 6,696,336 B2 | 2/2004 | DeBoer et al. | |
| 6,790,725 B2 | 9/2004 | Coursey | |
| 6,974,993 B2 | 12/2005 | Coursey | |
| 7,105,403 B2 | 9/2006 | Graettinger et al. | |
| 7,109,089 B2 | 9/2006 | Torek et al. | |
| 7,125,781 B2 | 10/2006 | Manning et al. | |
| 7,214,978 B2 | 5/2007 | Torek et al. | |
| 7,282,756 B2 | 10/2007 | Agarwal et al. | |
| 7,329,576 B2 | 2/2008 | Sandhu et al. | |
| 2001/0000492 A1 | 4/2001 | Figura | |

(Continued)

OTHER PUBLICATIONS

Liu et al., ALD of Hafnium Oxide Thin Films from Tetrakis (ethylmethylamino)hafnium and Ozone, Journal od the Electrochemical Society, 152 (3) G213-G219 (2005).

*Primary Examiner* — Michelle Mandala
*Assistant Examiner* — Shaka White
(74) *Attorney, Agent, or Firm* — TraskBritt

(57) ABSTRACT

Semiconductor device structures include an at least partially formed container capacitor having a generally cylindrical first conductive member with at least one inner sidewall surface, a lattice material at least partially laterally surrounding an upper end portion of the first conductive member, an anchor material, and at least one aperture extending through the lattice material between the at least partially formed container capacitor and an adjacent at least partially formed container capacitor. Other structures include an at least partially formed container capacitor, a lattice material, and an anchor material disposed over a surface of the lattice material and at least a portion of an end surface of the first conductive member and forming a chemical barrier over at least a portion of an interface between the lattice material and the upper end portion of the first conductive member.

19 Claims, 8 Drawing Sheets

(56) References Cited

U.S. PATENT DOCUMENTS

| | | |
|---|---|---|
| 2001/0001730 A1 | 5/2001 | Figura |
| 2001/0038116 A1 | 11/2001 | Figura et al. |
| 2002/0001960 A1 | 1/2002 | Wu et al. |
| 2002/0036302 A1 | 3/2002 | Figura |
| 2002/0058392 A1 | 5/2002 | Figura et al. |
| 2005/0026361 A1 | 2/2005 | Graettinger et al. |
| 2005/0045488 A1 | 3/2005 | Paneccasio et al. |
| 2005/0124163 A1 | 6/2005 | Drynan et al. |
| 2005/0189575 A1 | 9/2005 | Torek et al. |
| 2005/0191584 A1 | 9/2005 | Shea et al. |
| 2005/0191805 A1 | 9/2005 | Torek et al. |
| 2005/0191856 A1 | 9/2005 | Torek et al. |
| 2006/0014344 A1* | 1/2006 | Manning ................ 438/243 |
| 2006/0141784 A1 | 6/2006 | Paneccasio, Jr. et al. |
| 2006/0148190 A1 | 7/2006 | Busch et al. |
| 2006/0157767 A1 | 7/2006 | Drynan et al. |
| 2006/0263979 A1 | 11/2006 | Nejad et al. |
| 2006/0289389 A1 | 12/2006 | Shea |
| 2007/0001207 A1 | 1/2007 | Graettinger et al. |
| 2007/0020923 A1 | 1/2007 | Kraus et al. |
| 2007/0262048 A1 | 11/2007 | Rana et al. |

* cited by examiner

SEMICONDUCTOR DEVICES AND STRUCTURES INCLUDING AT LEAST PARTIALLY FORMED CONTAINER CAPACITORS

CROSS-REFERENCE TO RELATED APPLICATION

This application is a continuation of U.S. patent application Ser. No. 12/365,519, filed Feb. 4, 2009, now U.S. Pat. No. 8,058,126, issued on Nov. 15, 2011, the disclosure of which is hereby incorporated herein by this reference in its entirety.

TECHNICAL FIELD

Embodiments of the present invention relate to semiconductor devices that include one or more integrated circuits having container capacitors therein, and to methods of forming such semiconductor devices.

BACKGROUND

Semiconductor devices include one or more integrated circuits that can be used to store data, process electronic signals, etc. Such semiconductor devices are used in virtually all modern electronic devices. There are several different types of semiconductor devices used in modern electronics including, for example, memory devices, electronic signal processors, devices for capturing or acquiring images, etc. Each of these semiconductor devices may conventionally comprise capacitors used for storing an electrical charge.

One particular type of capacitor that has been used in such semiconductor devices is referred to as a "container" capacitor. A container capacitor includes a first conductive member or "plate" that is shaped like a container or a cup having a generally cylindrical side wall and a bottom wall, such that the container capacitor has a closed bottom and an open top. A second conductive member, which may have the shape of a generally cylindrical plug, may be provided within the first conductive member, and a dielectric material may be provided between the first conductive member and the second conductive member to allow a capacitance to be provided therebetween.

To increase the capacitance of such container capacitors, double-sided container capacitors have been developed. Double-sided container capacitors also include a first conductive member that is shaped like a container or a cup having a generally cylindrical side wall and a bottom wall, such that the container capacitor has a closed bottom and an open top. A layer of dielectric material is then provided over the interior and exterior surfaces of the first conductive member, and a second conductive member is formed that extends over the generally cylindrical side wall and extends adjacent to both the interior surface and the exterior surface of the first conductive member (the dielectric material being disposed therebetween). Thus, the second conductive member is disposed adjacent the inside surfaces and the outside surfaces of the first conductive member to form the double-sided container.

During the formation of such double-sided capacitors, the first conductive members are often formed by lining the exposed surfaces within generally cylindrical blind recesses formed in a relatively thick layer of dielectric material with conductive material. After forming the first conductive members, but prior to forming the second conductive members, the relatively thick layer of dielectric material surrounding the first conductive members is removed by, for example, a wet chemical etching process. However, after removing the relatively thick layer of dielectric material, the first conductive members are then laterally unsupported by solid material, since they are essentially free-standing and no longer laterally supported by the relatively thick layer of dielectric material. As a result, some of the free-standing first conductive members may lean together and contact one another prior to formation of the second conductive members, which may result in undesirable shorting between adjacent first conductive members.

In an effort to overcome these problems, a so-called "lattice layer" has been used to hold the open top ends of the first conductive members in place while the underlying relatively thick layer of dielectric material is removed from around the lateral sides of the first conductive members. In particular, the relatively thick layer of dielectric material may be provided on the semiconductor device in which the double-sided container capacitors are to be formed. A relatively thin lattice layer may be formed over the relatively thick layer of dielectric material, and generally cylindrical blind recesses then may be formed through the lattice layer and into the relatively thick layer of dielectric material. The first conductive members then may be formed by lining the exposed surfaces within the generally cylindrical blind recesses. Openings then may be formed through the lattice layer at selected locations to provide access to the underlying layer of dielectric material, and an etchant that will remove the layer of dielectric material without significantly removing the lattice layer may be used to remove the layer of dielectric material from underneath the lattice layer. In other words, the etchant will attack the layer of dielectric material through the holes formed at selected locations in the lattice layer, and will eventually remove the layer of dielectric material from underneath the lattice layer.

Even though the openings formed through the lattice layer at selected locations to provide access to the underlying layer of dielectric material may be located between adjacent conductive members of the capacitors such that at least a portion of each of the adjacent conductive members remains attached to the lattice layer, reagents used in subsequent processing steps (e.g., weak acids used in cleansing steps) may attack the interface between the lattice layer and the conductive members adjacent the openings formed through the lattice layer. As a result, the conductive members adjacent the openings in the lattice layer still may lean or collapse inward such that they touch adjacent conductive members, which may result in undesirable shorting between adjacent conductive members near the openings extending through the lattice layer.

For the reasons stated above and other reasons that will become apparent to those skilled in the art upon reading and understanding the present specification, there is a need in the art for improved methods of forming container capacitors in semiconductor devices.

BRIEF DESCRIPTION OF THE SEVERAL VIEWS OF THE DRAWINGS

FIG. 1 is a partial cross-sectional view of a partially formed semiconductor device prior to fabrication of container capacitors thereon.

FIG. 2 is a partial cross-sectional view like that of FIG. 1 illustrating the partially formed semiconductor device after forming recesses therein.

FIG. 3 is a partial cross-sectional view like that of FIG. 2 illustrating the partially formed semiconductor device after removing a mask therefrom.

FIG. 4 is a partial cross-sectional view like that of FIG. 3 illustrating the partially formed semiconductor device after providing a conductive material for forming first conductive members of double-sided container capacitors thereon.

FIG. 5 is a partial cross-sectional view like that of FIG. 4 illustrating the partially formed semiconductor device after removing a portion of a conductive material previously provided thereon.

FIG. 6 is a partial plan view of a surface of the partially formed semiconductor device shown in FIG. 5 (the top surface of the device from the perspective of FIG. 5).

FIG. 7 is a partial cross-sectional view like that of FIG. 5 illustrating the partially formed semiconductor device after providing a protective anchor material thereon.

FIG. 8 is a partial cross-sectional view like that of FIG. 7 illustrating the partially formed semiconductor device after providing an etch-resistant material thereon.

FIG. 9 is a partial cross-sectional view like that of FIG. 8 illustrating the partially formed semiconductor device after removing portions of various materials on the semiconductor device to provide access to a dielectric material.

FIG. 10 is a partial plan view of a surface of the partially formed semiconductor device shown in FIG. 9 (the top surface of the device from the perspective of FIG. 9).

FIG. 11 is a partial cross-sectional view like that of FIG. 9 illustrating the partially formed semiconductor device after removing dielectric material from the semiconductor device with an etchant.

FIG. 12 is a partial cross-sectional view like that of FIG. 11 illustrating the partially formed semiconductor device after removing an etch-resistant material previously provided thereon.

FIG. 13 is a partial cross-sectional view like that of FIG. 12 illustrating the partially formed semiconductor device after providing a dielectric material thereon.

FIG. 14 is a partial cross-sectional view like that of FIG. 13 illustrating the partially formed semiconductor device after providing a conductive material for forming second conductive members of double-sided container capacitors thereon.

FIG. 15 is a partial cross-sectional view like that of FIG. 14 illustrating the partially formed semiconductor device after providing a dielectric material thereon.

DETAILED DESCRIPTION

The illustrations presented herein are not meant to be actual views of any particular device or system, but are merely idealized representations which are employed to describe the present invention. Additionally, elements common between figures may retain the same numerical designation.

Embodiments of methods of the present invention that may be used to fabricate container capacitors, including double-sided container capacitors, are described below with reference to FIGS. 1 through 15.

Figure 1:
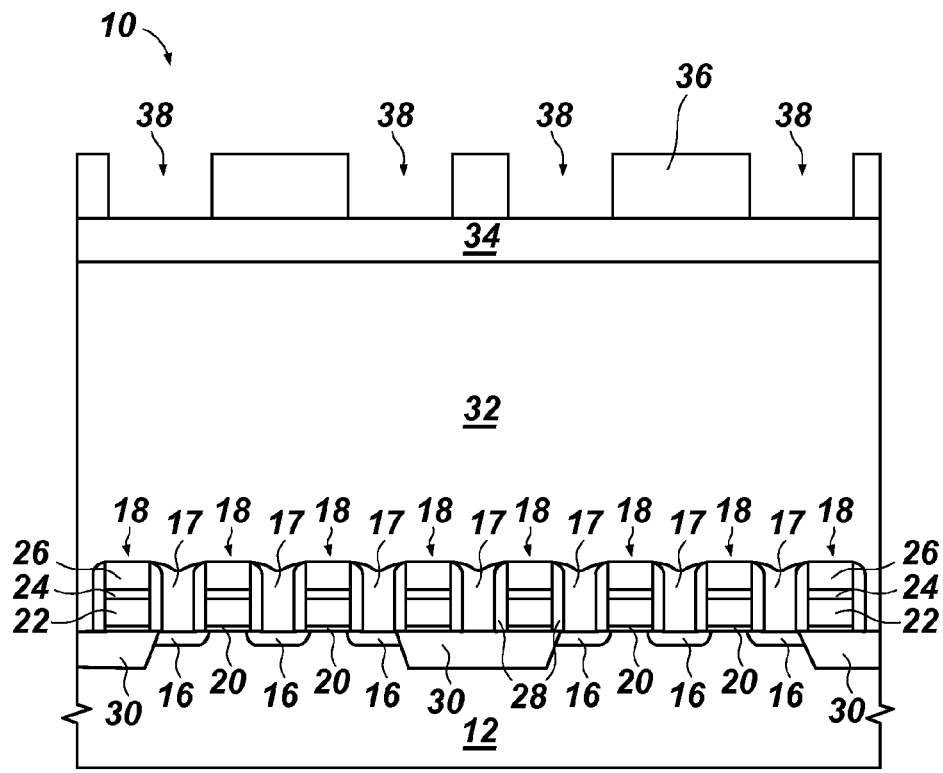
FIGS. 1 through 15 are used to illustrate embodiments of methods of the present invention that may be used to form semiconductor devices that include one or more integrated circuits having container capacitors therein, and to illustrate embodiments of semiconductor devices of the present invention that include such container capacitors.

FIG. 1 is a partial cross-sectional view of a partially formed semiconductor device 10. The semiconductor device 10 may be any type of semiconductor device that includes an integrated circuit having one or more container capacitors therein, as described in further detail below. For example, the semiconductor device 10 may be a memory device, an electronic signal processor device, or a device for capturing or acquiring an image.

Although FIG. 1 is a cross-sectional view, some of the elements are not cross-hatched in FIG. 1 to simplify the figure for purposes of illustration and description, although these elements are cross-hatched in the subsequent figures. The semiconductor device 10 includes a semiconductor substrate or wafer 12. A plurality of transistors may be formed on and in a surface of the wafer 12 (the upper surface of the wafer 12 from the perspective of FIG. 13). The transistors may include doped regions 16 in the wafer 12, which form the sources and drains of the transistors. Conductive lines or plugs 17 may be disposed over and in electrical contact with the doped regions 16. The transistors may also include gate stacks 18, each of which may include a gate dielectric layer 20, a doped polysilicon gate layer 22, a silicide layer 24, and a dielectric gate cap layer 26, as shown in FIG. 1. Dielectric sidewall spacers 28 may be formed on one or more lateral sides of the gate stacks 18. Nonconductive isolation regions 30 (e.g., shallow trench isolation (STI) regions) may be provided between some of the doped regions 16 in the wafer 12 to electrically isolate them from one another, as shown in FIG. 1.

Embodiments of the present invention are not limited by the form of the transistors, and the particular transistor structures shown in the figures is provided as merely one non-limiting example of a semiconductor device that may embody the present invention as discussed in further detail below. Furthermore, embodiments of the present invention may not include transistors.

One or more container capacitors may be formed on the semiconductor device 10. With continued reference to FIG. 1, a layer of support material 32 may be provided on the semiconductor device 10 over the semiconductor wafer 12 (e.g., over the transistors of the semiconductor device 10), as shown in FIG. 1. The layer of support material 32 may comprise, for example, a material such as a phosphosilicate glass (PSG), a borophosphosilicate glass (BPSG), carbon, or polysilicon (doped or undoped). The support material 32 may comprise a dielectric material, a conductive material, or a semiconductive material. A layer of dielectric lattice material 34 may be provided over the support material 32. The dielectric lattice material 34 may comprise, for example, silicon nitride ($Si_3N_4$). Other dielectric materials also may be used as the dielectric lattice material 34. The dielectric lattice material 34 may comprise any dielectric material that will not be removed from the semiconductor device 10 upon removal of the underlying layer of support material 32, as discussed below.

A mask 36 may be provided over the exposed major surface of the dielectric lattice material 34. The mask 36 includes apertures 38 that extend therethrough at selected locations over the semiconductor device 10 at which it is desired to form container capacitors. The mask 36 may be formed by, for example, depositing a layer of photoresist material over the exposed major surface of the dielectric lattice material 34, and selectively patterning (e.g., masking, exposing and developing) the layer of photoresist material to form the apertures 38 at the selected locations, as known in the art.

Figure 2:
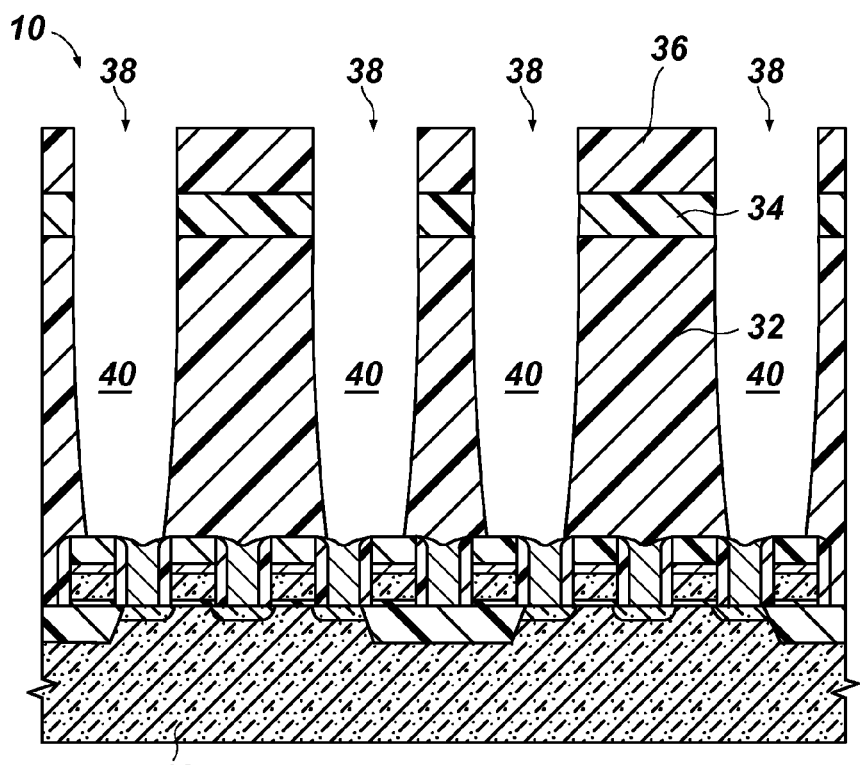
Figure 3:
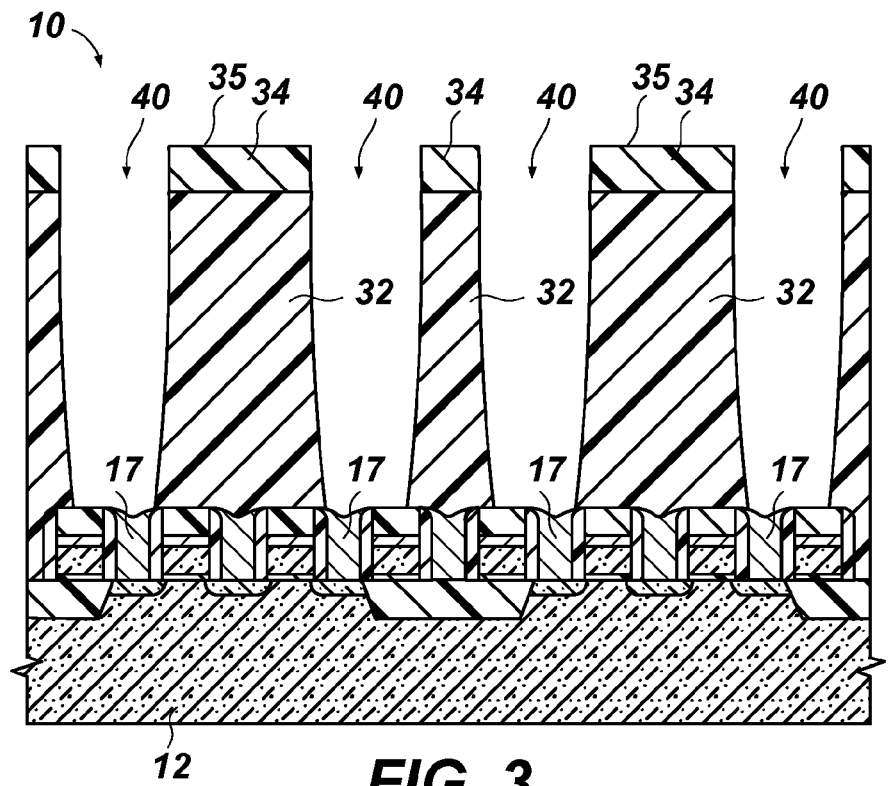

Referring to FIG. 2, holes 40 may be formed in the lattice material 34 and the support material 32. The holes 40 may be formed by exposing the lattice material 34 and the support material 32 to an etchant through the apertures 38 in the mask 36. For example, an anisotropic plasma etching process may be used to form the holes 40 in the lattice material 34 and the support material 32 through the apertures 38 in the mask 36. As shown in FIG. 3, the mask 36 may be removed from the partially formed semiconductor device 10 after forming the holes 40 in the lattice material 34 and the support material 32. The processing parameters for such an anisotropic plasma etching process will depend upon the compositions of the dielectric lattice material 34 and the support material 32, and various anisotropic plasma etching processes are known in the art for many materials that may be used for the support material 32.

Conductive structures, such as some of the conductive lines or plugs 17, may be exposed at the bottoms of the holes 40 after the etching process, as it may be desirable to provide electrical contact between such conductive structures and conductive members of container capacitors that will be formed within the holes 40, as discussed below.

Figure 4:
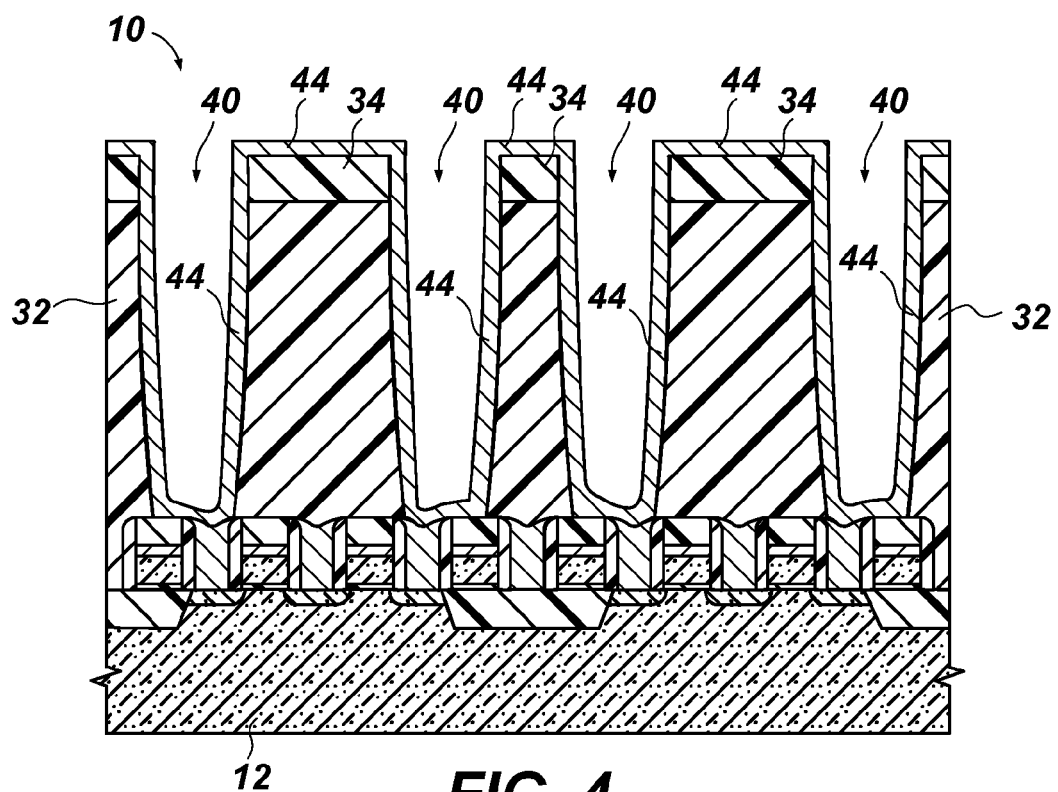

After forming the holes 40, the first conductive members of container capacitors may be formed in the holes 40. Referring to FIG. 4, a conductive material 44 may be provided on the semiconductor device 10 such that the conductive material 44 is disposed on, and lines, the surfaces of the semiconductor device 10 within the holes 40. For example, the conductive material 44 may be deposited on or formed on the semiconductor device 10 as a thin conformal blanket layer of the conductive material 44. As a non-limiting example, the conductive material 44 may comprise conductive titanium nitride (TiN). In other embodiments, the conductive material 44 may comprise tantalum nitride (TaN), a conductive metal material (e.g., tungsten, platinum, ruthenium), or a conductive polysilicon material (e.g., doped polysilicon).

The conductive material 44 may be formed on the semiconductor device 10 using, for example, a chemical vapor deposition (CVD) process or an atomic layer deposition process. A layer of conductive titanium nitride (TiN) may be formed, for example, using a chemical vapor deposition (CVD) process by flowing titanium tetrachloride (TiCl$_4$) and ammonia (NH$_3$), or by using an atomic layer deposition (ALD) process such as, for example, those disclosed in U.S. Patent Application Publication Number 2007/0020923 A1, which was published Jan. 25, 2007 and entitled "ALD Formed Titanium Nitride Films," the disclosure of which patent application is incorporated herein in its entirety by reference.

As a non-limiting example, the layer of conductive material 44 may have an average thickness of between about five nanometers (5 nm) and about twenty nanometers (20 nm).

Figure 5:
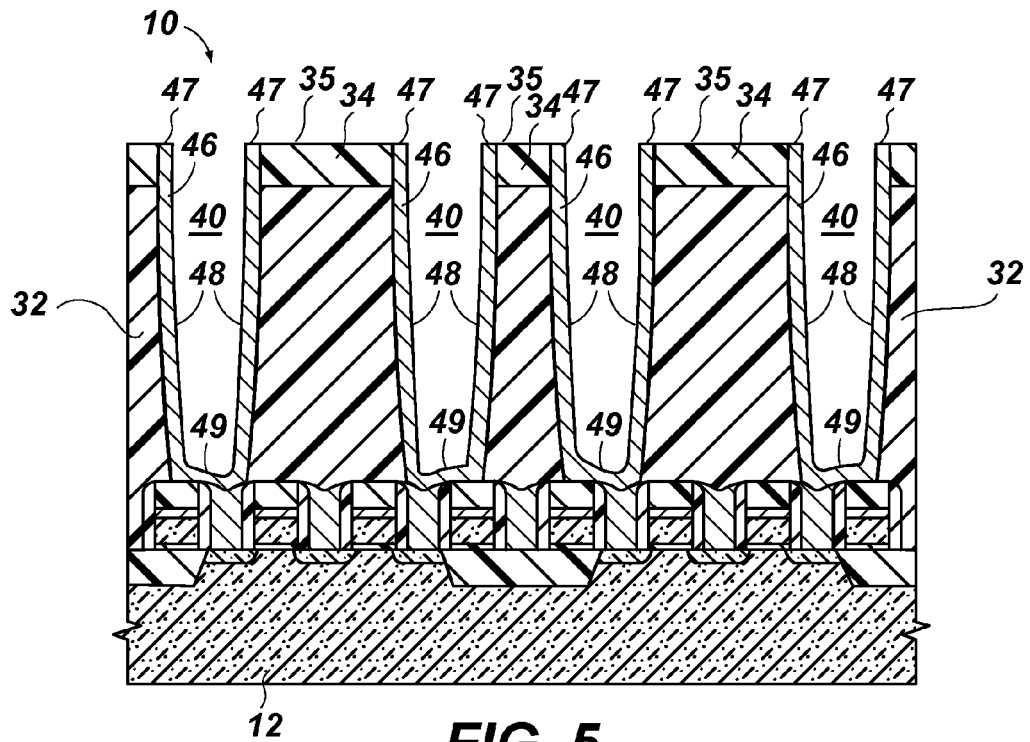

Referring to FIG. 5, conductive material 44 disposed on the exposed major surface 35 of the lattice material 34 outside the holes 40 may be removed to electrically isolate the first conductive members 46 of the container capacitors being formed. For example, a planarization process may be used to remove conductive material 44 on and over the exposed major surface 35 of the lattice material 34 outside the holes 40. Such a planarization process may include a chemical planarization process, a mechanical planarization process, a chemical-mechanical planarization (CMP) process, or a combination of any of the foregoing.

Figure 6:
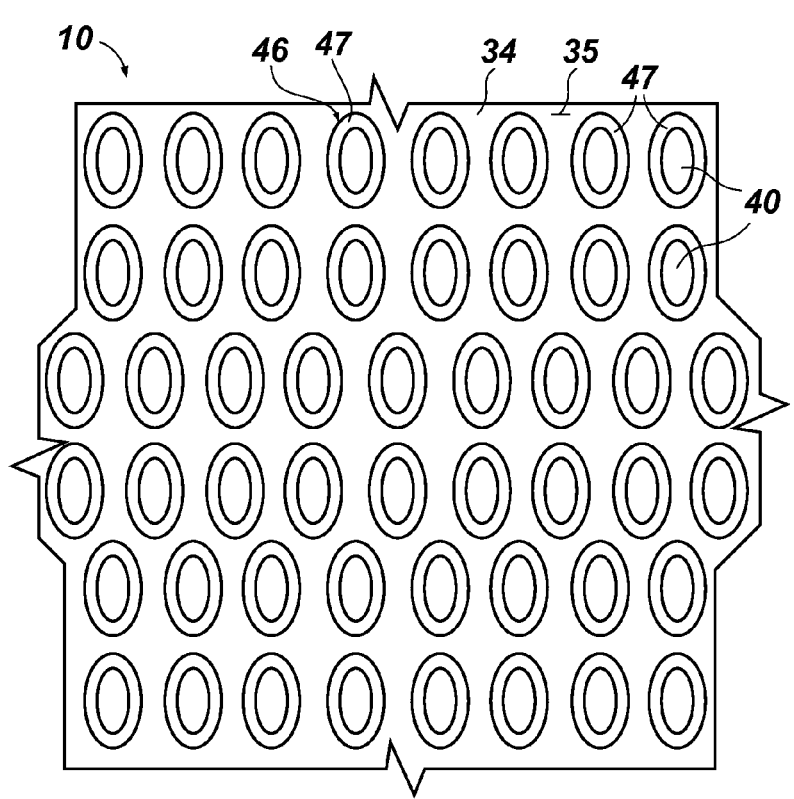

FIG. 6 is a partial plan view of a major surface of the partially formed semiconductor device 10 shown in FIG. 5 (the top surface of the semiconductor device 10 from the perspective of FIG. 5). As shown in FIGS. 5 and 6, at this stage of the fabrication process, a major longitudinal portion or section of each of the first conductive members 46 may be laterally surrounded and supported by the support material 32, and an upper end portion of each of the first conductive members 46 may be laterally surrounded and supported by the lattice material 34. As also shown in FIGS. 5 and 6, each of the first conductive members 46 of the container capacitors may be shaped like a container or a cup having at least one lateral side wall (which may be generally cylindrical in shape) and a bottom wall (which may continuous and integrally formed with the lateral side wall), such that each first conductive member 46 has a closed end (the bottom end from the perspective of FIG. 5) and an open end (the top end from the perspective of FIG. 5). As shown in FIG. 5, the first conductive members 46 are formed over the generally planar substrate or wafer 12 and oriented to extend longitudinally generally perpendicular to the generally planar wafer 12. As shown in FIG. 6, the first conductive members 46 may have an oval transverse cross-sectional shape. In other embodiments, the first conductive members 46 may have a circular transverse cross-sectional shape, or another transverse cross-sectional shape (e.g., generally triangular or generally rectangular). FIG. 6 illustrates the exposed major surface 35 of the lattice material 34 and an exposed end surface 47 of each of the first conductive members 46 of the container capacitors being formed on the semiconductor device 10.

Figure 7:
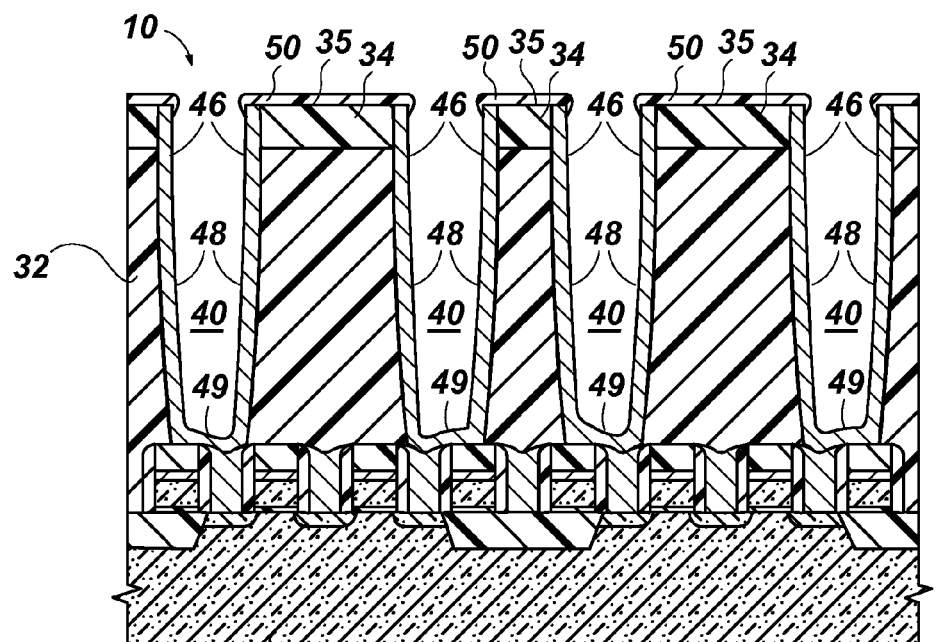

Referring to FIG. 7, a protective anchor material 50 is provided on and over the exposed major surface 35 of the lattice material 34 and the exposed end surface 47 (see FIG. 5) of each of the first conductive members 46 of the container capacitors. The protective anchor material 50 may be used to physically anchor at least a portion of the open ends (upper ends from the perspective of FIG. 7) of the first conductive members 46 to the laterally surrounding lattice material 34. In other words, at least a portion of the protective anchor material 50 forms a structural anchor that serves to retain the open ends of the conductive members 46 in their intended position (e.g., the position in which they are formed). The protective anchor material 50 also protects the seams or interfaces between the open ends of the first conductive members 46 and the laterally surrounding lattice material 34 from reagents used in subsequent processing steps. In other words, at least a portion of the protective anchor material 50 forms a chemical barrier that serves to protect the seams or interfaces between the open ends of the first conductive members 46 and the laterally surrounding lattice material 34 from chemical reagents.

The protective anchor material 50 may comprise a low step coverage material. In other words, the protective anchor material 50 may comprise a material that, when a layer of the material having a thickness of less than about twenty nanometers (20 nm) is formed on or deposited on laterally extending (i.e., horizontally extending from the perspective of FIG. 7) surfaces of the semiconductor device 10, will not be significantly formed on or deposited on the generally vertically extending surfaces of the semiconductor device 10. As used herein, the term "step coverage" means the ratio of the thickness of a layer of a material along generally vertically extending surfaces to the thickness of the layer along generally laterally extending surfaces. In some embodiments of the present invention, the protective anchor material 50 may have a step coverage of less than about 0.5. In additional embodiments of the present invention, the protective anchor material 50 may have a step coverage of less than about 0.3.

As shown in FIG. 7, the protective anchor material 50 may extend somewhat down onto the vertically extending inner sidewall surfaces 48 of the first conductive members 46, but may not significantly cover the inner sidewall surfaces 48 of the first conductive members 46. In some embodiments, the protective anchor material 50 may cover about twenty percent (20%) or less of the surface area of the vertically extending inner sidewall surfaces 48 of the first conductive members 46. In further embodiments, the protective anchor material 50 may cover about ten percent (10%) or less of the surface area of the vertically extending inner sidewall surfaces 48 of the first conductive members 46. In yet further embodiments, the inner sidewall surfaces 48 may be substantially, but not entirely free of the protective anchor material 50. In other embodiments, however, the inner sidewall surfaces 48 may be entirely free of the protective anchor material 50. Although not shown in FIG. 7, some protective anchor material 50 may be deposited on the generally laterally extending inner bottom surfaces 49 of the first conductive members 46 in some embodiments.

The protective anchor material 50 may comprise a dielectric material that will not be entirely removed or damaged by subsequent processing steps. By way of example and not limitation, the protective anchor material 50 may comprise a nitride material (e.g., $Si_3N_4$), transparent carbon (TC), or an oxide material (e.g., $ZrO_2$, $HfO_2$).

The protective anchor material 50 may be deposited as a layer having an average thickness of, for example, between about five nanometers (5 nm) and about twenty nanometers (20 nm). More particularly, the protective anchor material 50 may be deposited as a layer having an average thickness of between about ten nanometers (10 nm) and about fifteen nanometers (15 nm). In some embodiments, the layer of protective anchor material 50 may have a thickness that, based on its etch rate with respect to a subsequent etching process used to remove the support material 32, as described below, will not be entirely removed by the etchant or etchants used in such etching process. In other embodiments, however, a barrier material may be provided over at least a portion of the layer of protective anchor material 50. In such embodiments, the layer of protective anchor material 50 may have a reduced thickness, as it may be protected from the etchant used to remove the support material 32 by the barrier material, as described below.

By way of example and not limitation, the protective anchor material 50 may be deposited on the semiconductor device 10 using a chemical vapor deposition (CVD) process (e.g., a plasma-enhanced chemical vapor deposition process (PECVD)). By way of example and not limitation, such a process may be conducted in a deposition chamber at a temperature of between about 400° C. and about 550° C., at a pressure of between about one (1) Torr and about fifteen (15) Torr, a flow of $SiH_4$ of between about fifty standard cubic centimeters per minute (50 sccm) and about two thousand standard cubic centimeters per minute (2,000 sccm), and a flow of $NH_3$ of between about five hundred standard cubic centimeters per minute (500 sccm) and about ten thousand standard cubic centimeters per minute (10,000 sccm).

Figure 8:
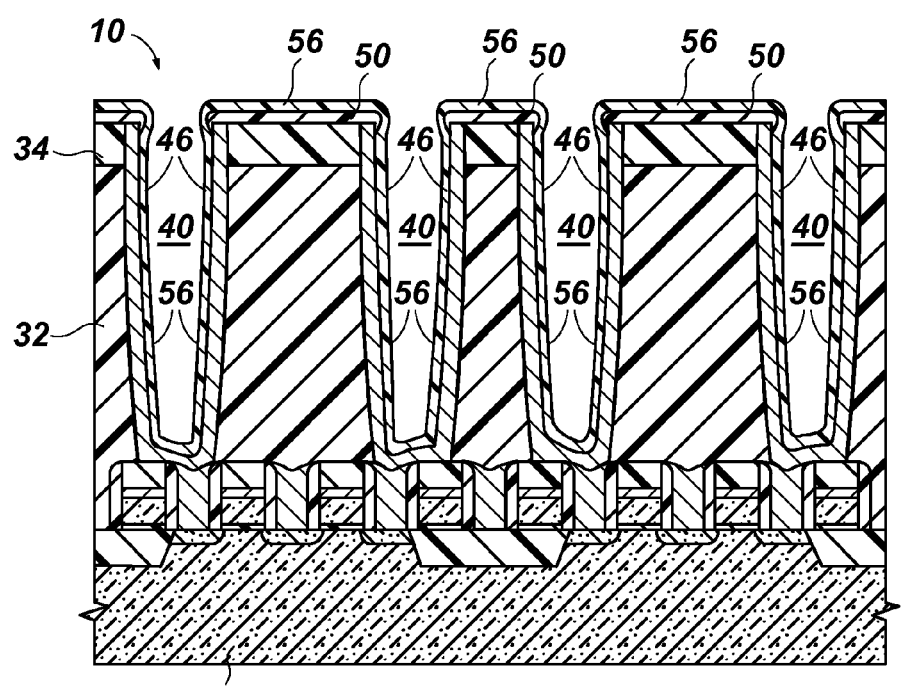

Referring to FIG. 8, after providing the protective anchor material 50 on and over the exposed major surface 35 of the lattice material 34 and the exposed end surface 47 of each of the first conductive members 46 of the container capacitors, a relatively thin layer of barrier material 56 optionally may be provided over the semiconductor device 10. As used herein, the term "barrier material" means and includes any material that serves as a barrier to protect another material from one or more reagents, although barrier materials may also serve other additional purposes.

The barrier material 56 may serve as a barrier to protect the protective anchor material 50 from an etchant or etchants used in a subsequent manufacturing process. For example, the barrier material 56 may serve as a barrier to protect the protective anchor material 50 from an etchant or etchants used to remove the support material 32, as described below. The barrier material 56 also may further physically anchor at least a portion of the upper ends of the first conductive members 46 to the laterally surrounding lattice material 34, and may provide additional protection to the seams or interfaces between the upper ends of the first conductive members 46 and the laterally surrounding lattice material 34 from reagents used in subsequent processing steps.

By way of example and not limitation, the barrier material 56 may comprise polysilicon (e.g., doped or undoped polysilicon).

The barrier material 56 may be deposited on or formed on the semiconductor device 10 as a relatively thin, conformal (i.e., high step coverage) blanket layer having an average thickness of, for example, between about one nanometer (1 nm) and about twenty nanometers (20 nm). In some embodiments, the barrier material 56 may be deposited on or formed on the semiconductor device 10 as a relatively thin blanket layer having an average thickness of less than about eight nanometers (8 nm).

The barrier material 56 may be provided on the semiconductor device 10 by, for example, forming a layer of the barrier material 56 on the semiconductor device 10 using a chemical vapor deposition (CVD) process. The process parameters for such a chemical vapor deposition (CVD) process will depend upon the composition of the barrier material 56, and various chemical vapor deposition (CVD) processes are known in the art for forming layers of barrier materials 56, such as polysilicon.

Figure 9:
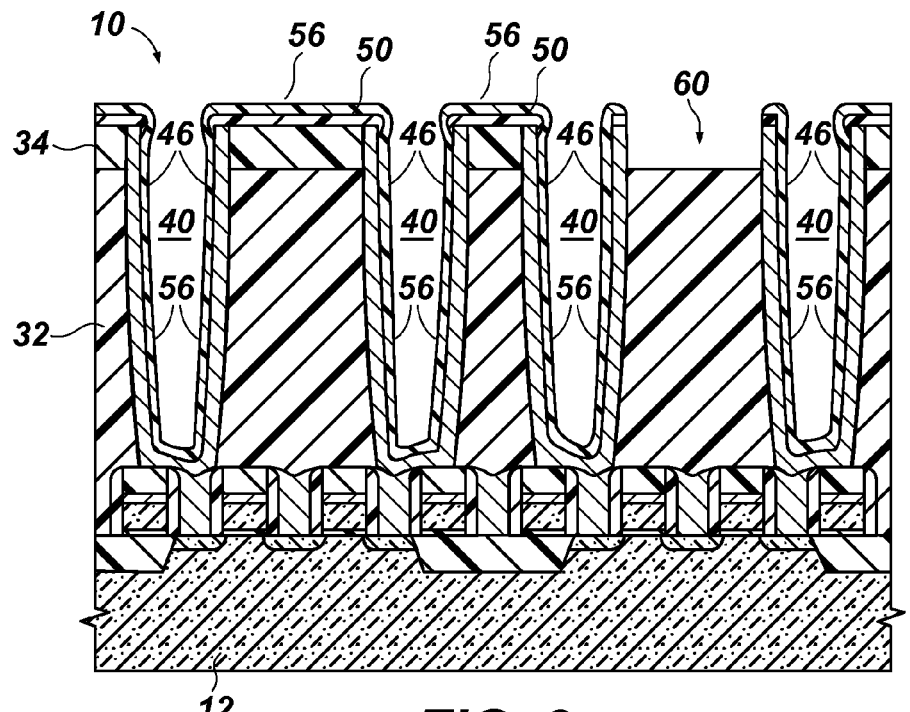
Figure 10:
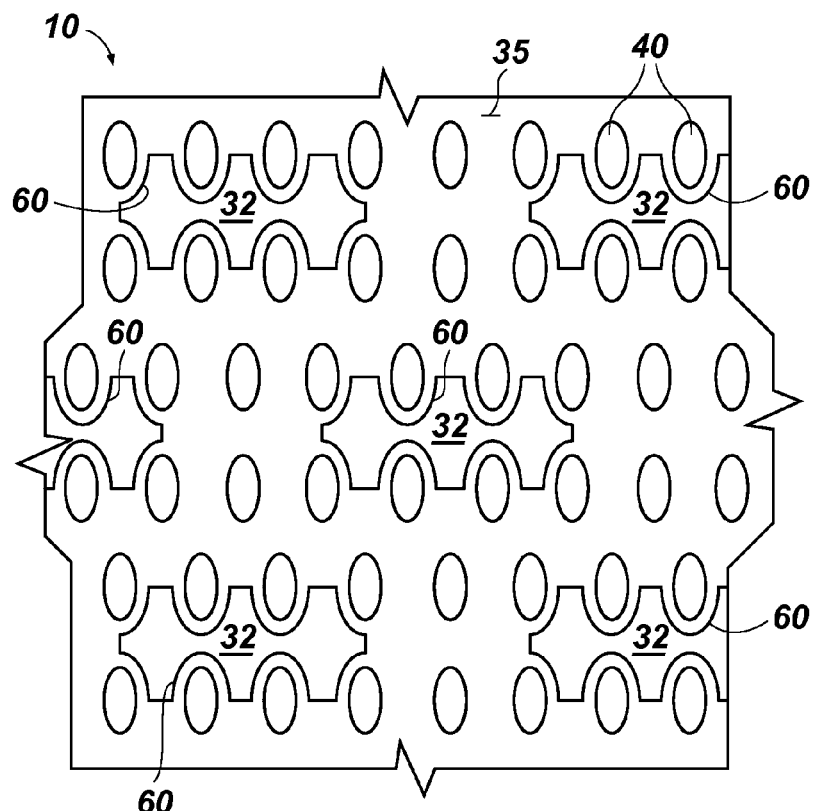

After providing the optional barrier material 56 on the semiconductor device 10, the support material 32 may be removed out from underneath the lattice material 34. At this stage of the process, the support material 32 may not be significantly exposed on any exterior surface of the semiconductor device 10. Referring to FIGS. 9 and 10, apertures 60 may be formed through the barrier material 56 and the lattice material 34 at selected locations to expose the underlying support material 32. FIG. 9 is a partial cross-sectional view of the partially formed semiconductor device 10 illustrating an aperture 60 formed through the barrier material 56 and the lattice material 34 between adjacent first conductive members 46 of the container capacitors being formed. FIG. 10 is a plan view of the upper major surface of the partially formed semiconductor device 10 shown in FIG. 9 (the upper surface from the perspective of FIG. 9), and illustrates a plurality of apertures 60 formed through the barrier material 56 and the lattice material 34 at selected locations to expose the underlying support material 32.

The apertures 60 may be formed through the optional barrier material 56, the protective anchor material 50, and the lattice material 34 using a masking and etching process such as, for example, an anisotropic plasma etching process, as known in the art.

Figure 11:
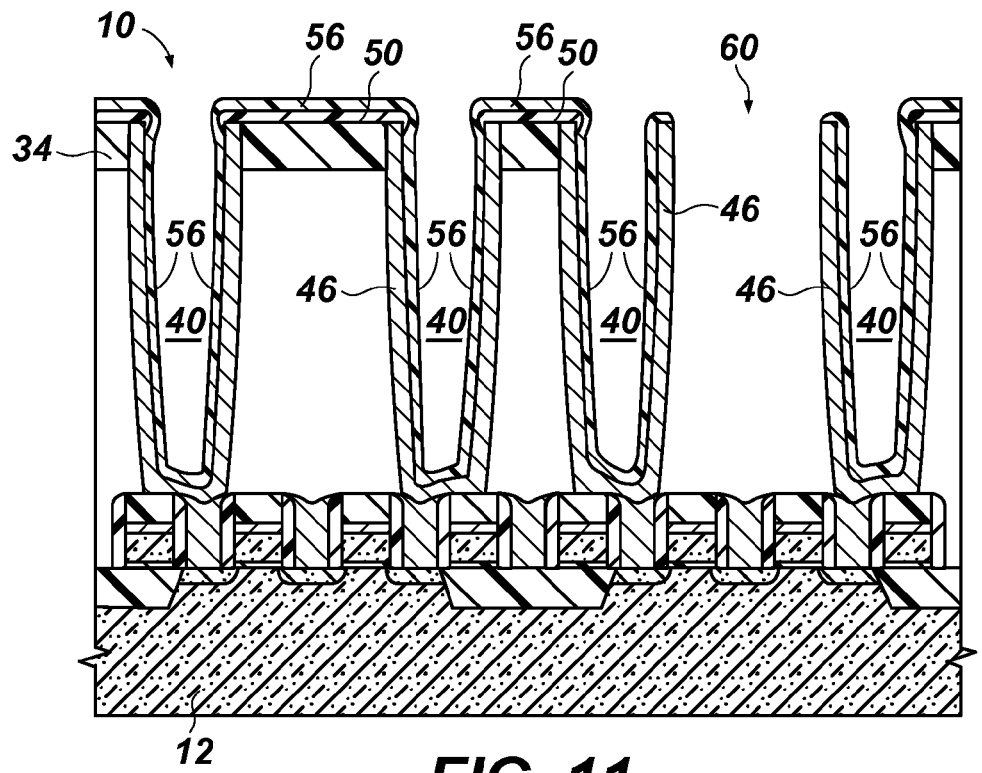

As shown in FIG. 11, after forming the apertures 60 through the barrier material 56, the protective anchor material 50, and the lattice material 34, an isotropic wet chemical etching process may be used to remove the support material 32 out from between the lattice material 34 and the semiconductor substrate or wafer 12. The etchant will initially remove the support material 32 exposed at the surface therein in the apertures 60 and will eventually work its way through the semiconductor device 10 in the lateral directions between the lattice material 32 and the wafer 12. The etchant may be laterally confined, however, to the regions of the semiconductor device 10 in which the container capacitors are being formed by a trench or moat (not shown) that circumscribes such regions of the semiconductor device 10 and is lined or filled with a material resistant to the etchant.

The etchant used may be selected such that the etchant will remove the support material 32 at an etch rate that is higher than any etch rate at which the etchant will remove the lattice material 34, the protective anchor material 50, and the barrier material 56. For example, if the support material 32 comprises a borophosphosilicate glass (BPSG), the etchant may comprise relatively concentrated hydrofluoric acid (e.g., ten parts water to one part hydrofluoric acid (10:1 HF)), and each of the lattice material 34, the protective anchor material 50, and the barrier material 56 may comprise material that will not be removed by the concentrated hydrofluoric acid, or will be removed at significantly lower etch rates relative to the borophosphosilicate glass to allow the borophosphosilicate glass to be at least substantially removed from the semiconductor device 10 without entirely removing at least the lattice material 34 and the protective anchor material 50.

After removing the support material 32 from the semiconductor device 10, as shown in FIG. 11, a major longitudinal portion or section of each of the first conductive members 46 may be laterally unsupported by solid material. The lattice material 34, however, provides lateral support to the open upper end portions or sections of the first conductive members 46, which helps to prevent the first conductive members 46 from leaning or tilting to the side and contacting adjacent first conductive members 46. As can be seen in FIG. 11, the first conductive members 46 that are disposed adjacent the apertures 60 formed through the lattice material 34, however, may not be entirely surrounded by the lattice material 34. In other words, the lattice material 34 may only partially surround the open upper ends of first conductive members 46 disposed adjacent the apertures 60 in the lattice material 34.

Embodiments of partially formed semiconductor devices of the present invention include the protective anchor material 50 on and over the major surface 35 of the lattice material 34 and at least a portion of the end surfaces 47 of each of the first conductive members 46, which provides additional structural anchoring of the upper ends of the first conductive members 46 to the laterally surrounding lattice material 34 and protects the seams or interfaces between the upper ends of the first conductive members 46 and the laterally surrounding lattice material 34 from reagents used in subsequent processing steps. As a result, the protective anchor material 50 may be used to prevent or reduce the occurrence of first conductive members 46 disposed adjacent the apertures 60 tipping or tilting away from the lattice material 34 and contacting adjacent first conductive members 46. In other words, in embodiments of semiconductor devices 10 of the present invention, the first conductive members 46 disposed adjacent the apertures 60 may be relatively more structurally anchored to the lattice material 34, and the interfaces therebetween may be relatively more protected from reagents used in subsequent processing steps, relative to presently known semiconductor devices.

Figure 12:
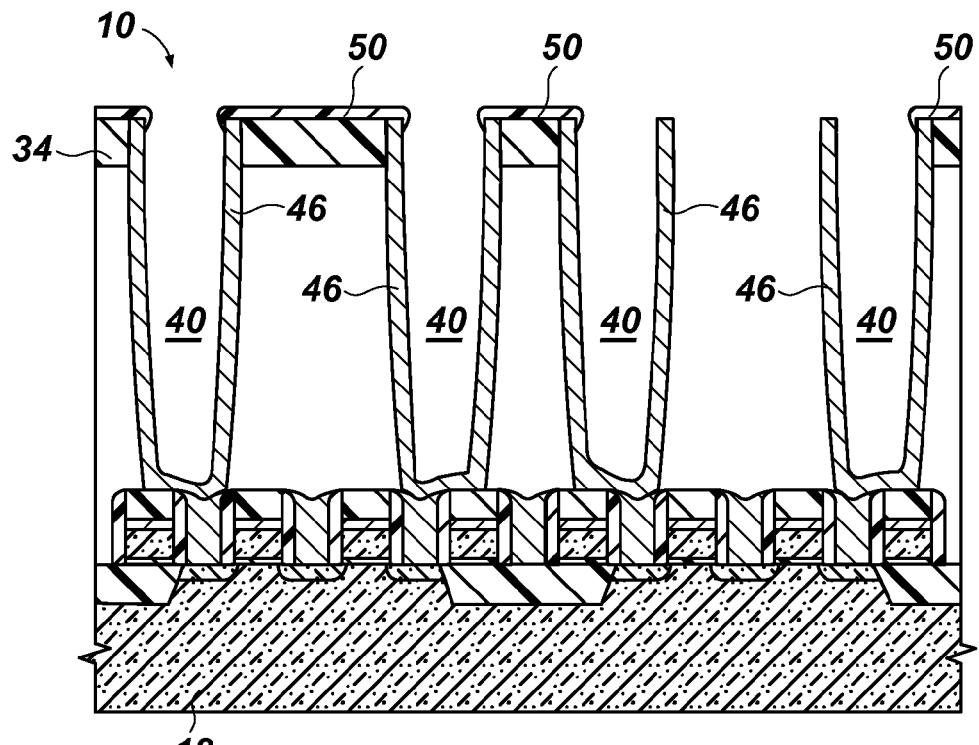

After removing the support material 32 from the semiconductor device 10, as shown in FIG. 11, the barrier material 56 may be removed from the semiconductor device 10 using, for example, a wet chemical etching process to form the structure shown in FIG. 12. If the barrier material 56 comprises a layer of polysilicon material, aqueous ammonium hydroxide ($NH_3$ [aq]) may be used, for example, to remove the barrier material 56 from the semiconductor device 10.

After removing the barrier material 56, the partially formed semiconductor device 10 may be subjected to a cleaning process to remove trace amounts of any unwanted materials present thereon before continuing fabrication of the capacitor containers. For example, the semiconductor device 10 may be cleansed using relatively dilute hydrofluoric acid (e.g., one hundred parts water to one part hydrofluoric acid (100:1 HF)). As previously mentioned, the protective anchor material 50 may protect the seams or interfaces between the upper ends of the first conductive members 46 and the laterally surrounding lattice material 34 from reagents used in such a cleansing step.

Figure 13:
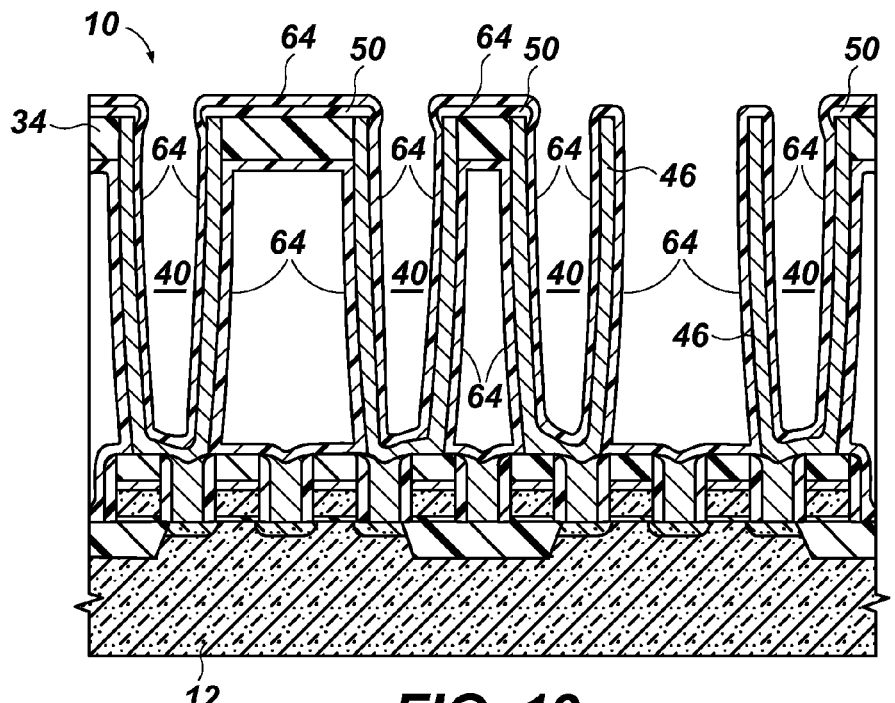

Referring to FIG. 13, a dielectric material 64 may be provided on exposed surfaces of the first conductive members 46. The dielectric material 64 also may be disposed on other surfaces of the semiconductor device 10. The dielectric material 64 ultimately will be disposed between the first conductive members 46 and the second conductive members 68 of the container capacitors being formed and used to enable the generation of a capacitance therebetween.

The dielectric material 64 may comprise, for example, an oxide material such as zirconium oxide ($ZrO_2$), hafnium oxide ($HfO_2$), aluminum oxide ($Al_2O_3$), tantalum oxide ($Ta_2O_5$), or a combination of such oxide materials.

The dielectric material 64 may form a dielectric layer having an average thickness of, for example, between about five nanometers (5 nm) and about ten nanometers (10 nm), although the thickness of the layer of dielectric material 64 may be at least partially determined by the composition of the dielectric material 64 (and the dielectric constant thereof), the methods used to form the layer of dielectric material 64, and any desired capacitance of the container capacitors, as known in the art.

The dielectric material 64 may be formed on the exposed surfaces of the first conductive members 46 using, for example, an atomic layer deposition (ALD) process or a chemical vapor deposition (CVD) process. For example, a layer of hafnium oxide ($HfO_2$) may be deposited by atomic layer deposition (ALD) using appropriate precursor materials such as, for example, hafnium alkylamides and water, or tetrakis(ethylmethylamino) hafnium (TEMAH) and ozone ($O_3$).

Figure 14:
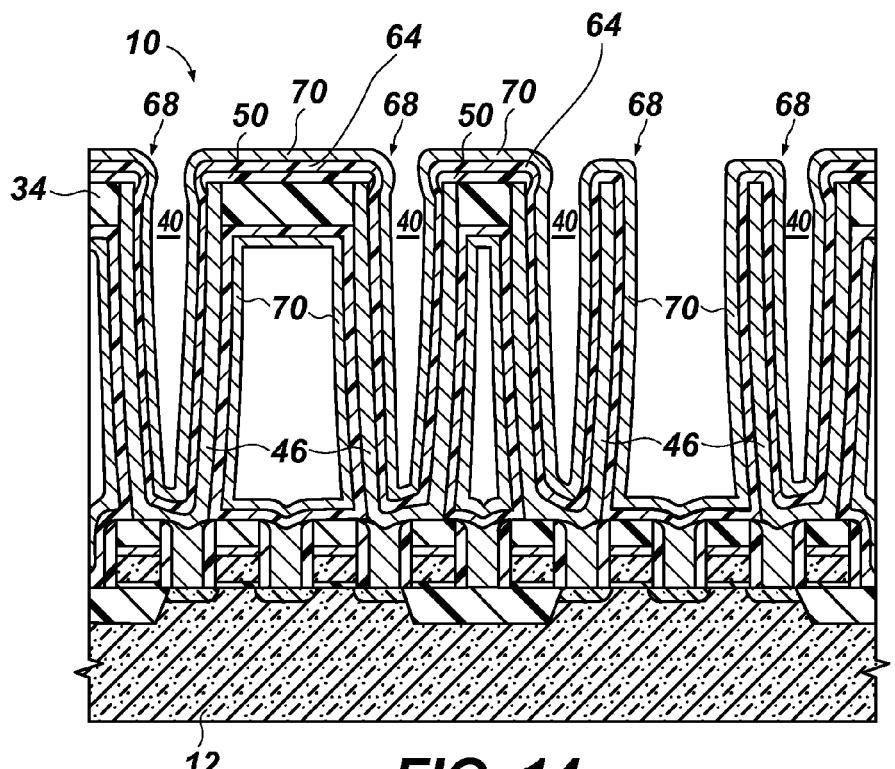

Referring to FIG. 14, after providing the dielectric material 64 on the exposed surfaces of the first conductive members 46, the second conductive members 68 of the container capacitors may be formed by providing a conductive material 70 over the dielectric material 64. As shown in FIG. 14, the conductive material 70 may be provided on the dielectric material 64 on both the inner and outer surfaces of the first conductive members 46 so as to form double-sided container capacitors.

The conductive material 70 may be deposited on or formed on the dielectric material 64 as a thin conformal blanket layer of the conductive material 70. As a non-limiting example, the conductive material 70 may comprise conductive titanium nitride (TiN). The conductive material 44 may be formed on the semiconductor device 10 using, for example, a chemical vapor deposition (CVD) process or an atomic layer deposition process. A layer of conductive titanium nitride (TiN) may be formed, for example, using a chemical vapor deposition (CVD) process by flowing titanium tetrachloride ($TiCl_4$) and ammonia ($NH_3$), or by using an atomic layer deposition (ALD) process such as, for example, those disclosed in U.S. Patent Application Publication Number 2007/0020923 A1, which was published Jan. 25, 2007 and entitled "ALD Formed Titanium Nitride Films."

Figure 15:
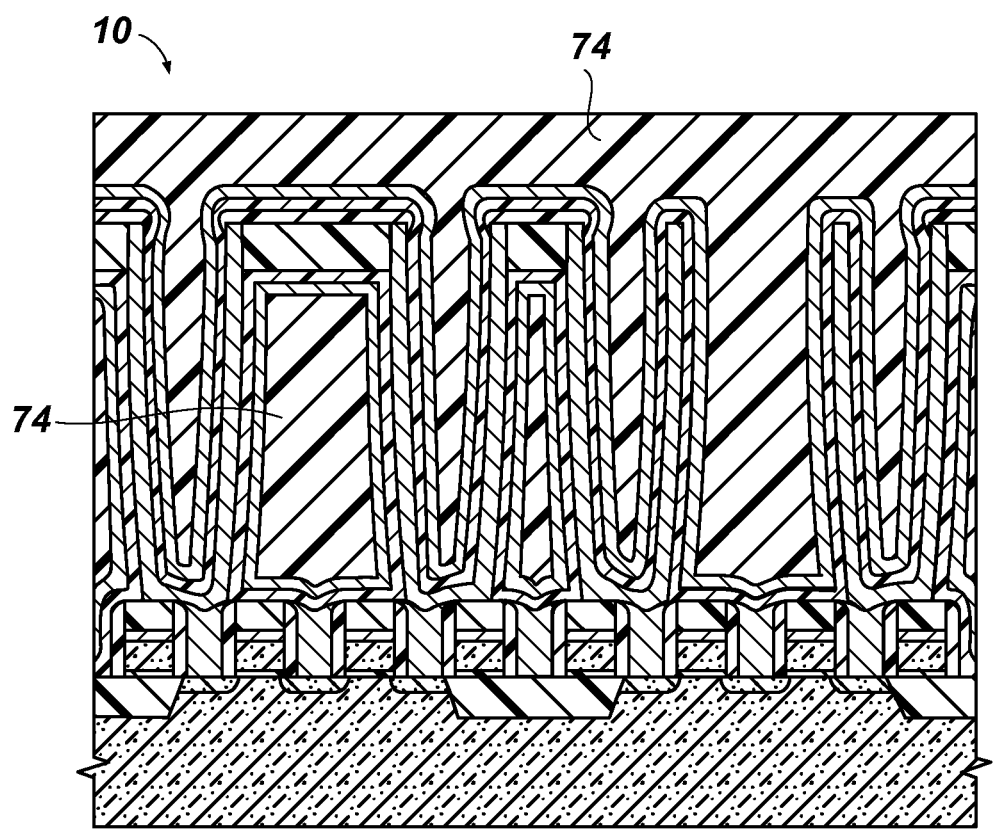

Referring to FIG. 15, after providing the conductive material 70 on the semiconductor device 10 and forming the second conductive members 68 of the double-sided container capacitors as previously described, a dielectric material 74 may be provided on the semiconductor device 10 to bury and electrically isolate the container capacitors therein. The dielectric material 74 may comprise, for example, a borophosphosilicate glass (BPSG) or an oxide material (e.g., aluminum oxide ($Al_2O_3$), zirconium oxide ($ZrO_2$), or hafnium oxide ($HfO_2$)).

Although not shown, electrical contact between one or more conductive lines or traces (not shown) over the dielectric material 74 and the second conductive members 68 of the container capacitors may be established by forming one or more conductive vias (not shown) through the dielectric material 74 to the conductive material 70 of the second conductive members 68 of the double-sided container capacitors.

At this stage of the process, fabrication of the double-sided container capacitors may be at least essentially complete, and subsequent processing may be carried out to complete fabrication of the semiconductor device 10 in accordance with processes known in the art.

Although embodiments of the present invention have been described hereinabove with reference to the fabrication of double-sided container capacitors, it is understood that embodiments of the present invention also may include single-sided container capacitors and methods of fabricating single-sided container capacitors.

CONCLUSION

In some embodiments, the present invention includes semiconductor device structures that comprise an at least partially formed container capacitor that includes a generally cylindrical conductive member having at least one inner sidewall surface. A lattice material at least partially surrounds an end portion of the first conductive member, and an anchor material is disposed over the lattice material and at least a portion of an end surface of the conductive member so as to cover at least a portion of an interface between the lattice material and the end portion of the conductive member. The at least one inner sidewall surface of the generally cylindrical conductive member may be at least substantially free of the anchor material.

In additional embodiments, the present invention includes semiconductor device structures that comprise a conductive member having a generally cylindrical lateral sidewall and at least one open end. A dielectric lattice material at least partially surrounds the open end of the conductive member. A dielectric anchor material covers at least a portion of a surface of the dielectric lattice material and at least a portion of an end surface of the open end of the conductive member and extends across an interface between the dielectric lattice material and the open end of the conductive member. A barrier material extends over at least a portion of the dielectric anchor material and is disposed on at least a portion of an inner surface of the lateral sidewall of the conductive member.

Further embodiments of the present invention include methods of forming a semiconductor device structure. A generally cylindrical conductive member of a container capacitor is formed, and at least a portion of an open end of the conductive member is laterally supported with a lattice material. At least a portion of an open end of the conductive member is anchored to the lattice material with a low step coverage material that extends over at least a portion of a surface of the lattice material, at least a portion of an end surface of the conductive member, and at least a portion of an interface between the lattice material and the at least a portion of an open end of the conductive member.

In additional embodiments, the present invention includes methods of forming a semiconductor device in which a conductive container having a lateral sidewall and an open end is formed, and a layer of dielectric anchor material is formed over at least a portion of an end surface of the conductive container at the open end thereof, at least a portion of a dielectric lattice material surrounding the open end of the conductive container, and at least a portion of an interface between the conductive container and the dielectric anchor material without significantly covering an inner surface of the lateral sidewall of the conductive container with the layer of dielectric anchor material.

In yet further embodiments, the present invention includes methods of forming a semiconductor device in which at least one recess is formed through a layer of dielectric lattice material and a layer of another dielectric material extending over a semiconductor substrate, and a generally cylindrical first conductive member of a container capacitor is formed on exposed surfaces of the layer of dielectric lattice material and the layer of another dielectric material within the at least one recess. A layer of anchor material is formed that extends continuously over at least a portion of an end surface of the first conductive member, at least a portion of the layer of dielectric lattice material, and at least a portion of an interface between the layer of dielectric lattice material and the first conductive member. A conformal layer of barrier material is formed over at least a portion of the layer of anchor material and at least a portion of an inner sidewall surface of the generally cylindrical first conductive member. The layer of the another dielectric material is removed from between the layer of dielectric lattice material and the semiconductor substrate.

While the present invention has been described in terms of certain illustrated embodiments and variations thereof, it will be understood and appreciated by those of ordinary skill in the art that the invention is not so limited. Rather, additions, deletions and modifications to the illustrated embodiments may be effected without departing from the spirit and scope of the invention as defined by the claims that follow.

What is claimed is:

1. A semiconductor device structure comprising:
an at least partially formed container capacitor including a generally cylindrical first conductive member having at least one inner sidewall surface;
a lattice material at least partially laterally surrounding an upper end portion of the first conductive member;
an anchor material disposed over a surface of the lattice material and at least a portion of an end surface of the first conductive member and covering at least a portion of an interface between the lattice material and the upper end portion of the first conductive member, the at least one inner sidewall surface of the generally cylindrical first conductive member being at least substantially free of the anchor material; and
at least one aperture extending through the lattice material between the at least partially formed container capacitor and an adjacent at least partially formed container capacitor, the adjacent at least partially formed container capacitor including a generally cylindrical first conductive member having at least one inner sidewall surface.

2. The semiconductor device structure of claim 1, wherein the anchor material comprises a low step coverage material.

3. The semiconductor device structure of claim 2, wherein the anchor material comprises at least one of a nitride material, an oxide material, and transparent carbon material.

4. The semiconductor device structure of claim 1, further comprising a dielectric material over at least a portion of the generally cylindrical first conductive member.

5. The semiconductor device structure of claim 4, further comprising a second conductive member over the dielectric material.

6. The semiconductor device structure of claim 5, wherein the second conductive member over the dielectric material covers at least a portion of both the at least one inner sidewall surface and an outer sidewall surface of the first conductive member.

7. The semiconductor device structure of claim 1, wherein a major longitudinal portion of the generally cylindrical first conductive member of the at least partially formed container capacitor is laterally unsupported.

8. The semiconductor device structure of claim 1, wherein the semiconductor device structure comprises a fully formed dynamic random access memory (DRAM) semiconductor device, and wherein the at least partially formed container capacitor comprises a fully formed double-sided container capacitor of a plurality of double-sided container capacitors in the fully formed dynamic random access memory (DRAM) semiconductor device.

9. The semiconductor device structure of claim 1, wherein the at least one inner sidewall surface of the generally cylindrical first conductive member is free of the anchor material.

10. A semiconductor device structure comprising:
a plurality of at least partially formed container capacitors each including a generally cylindrical first conductive member having at least one inner sidewall surface;
a lattice material at least partially laterally surrounding an upper end portion of the first conductive member of each of the plurality of at least partially formed container capacitors;
an anchor material disposed over a surface of the lattice material and at least a portion of an end surface of the first conductive member of each of the plurality of at least partially formed container capacitors and covering at least a portion of an interface between the lattice material and the upper end portion of the first conductive member of each of the plurality of at least partially formed container capacitors, the at least one inner sidewall surface of the generally cylindrical first conductive member of each of the plurality of at least partially formed container capacitors being at least substantially free of the anchor material; and
at least one aperture extending through the lattice material between at least two adjacent at least partially formed container capacitors.

11. The semiconductor device structure of claim 10, further comprising a second conductive member over the anchor material.

12. A semiconductor device structure comprising:
an at least partially formed container capacitor including a generally cylindrical first conductive member having at least one inner sidewall surface;
a lattice material at least partially laterally surrounding an upper end portion of the first conductive member; and
an anchor material disposed over a surface of the lattice material and at least a portion of an end surface of the first conductive member, wherein the anchor material forms a chemical barrier over at least a portion of an interface between the lattice material and the upper end portion of the first conductive member, wherein the at least one inner sidewall surface of the generally cylindrical first conductive member is at least substantially free of the anchor material.

13. The semiconductor device structure of claim 12, wherein the at least one inner sidewall surface of the generally cylindrical first conductive member is entirely free of the anchor material.

14. The semiconductor device structure of claim 12, wherein a generally laterally extending inner bottom surface of the generally cylindrical first conductive member is at least substantially free of the anchor material.

15. The semiconductor device structure of claim 12, further comprising a barrier material over the at least partially formed container capacitor, the lattice material, and the anchor material.

16. The semiconductor device structure of claim 15, wherein the barrier material comprises a layer of polysilicon.

17. The semiconductor device structure of claim 12, further comprising a dielectric material over the at least partially formed container capacitor, the lattice material, and the anchor material.

18. The semiconductor device structure of claim 17, further comprising another conductive member over the dielectric material.

19. The semiconductor device structure of claim 12, wherein the anchor material has an average thickness of between about 5 nm and about 20 nm.

* * * * *